(12) United States Patent
Barbul et al.

(10) Patent No.: US 11,597,647 B2
(45) Date of Patent: Mar. 7, 2023

(54) PACKAGED DIE AND ASSEMBLING METHOD

(71) Applicant: TDK Corporation, Tokyo (JP)

(72) Inventors: Andreas Barbul, Munich (DE);
Matthias Schmidt, Munich (DE);
Matthias König, Munich (DE)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/116,884

(22) Filed: Dec. 9, 2020

(65) Prior Publication Data

US 2021/0238028 A1 Aug. 5, 2021

(30) Foreign Application Priority Data

Jan. 31, 2020 (DE) .......................... 102020102493.2

(51) Int. Cl.
*B81B 7/00* (2006.01)
*H01L 23/00* (2006.01)
(Continued)

(52) U.S. Cl.
CPC ........ *B81B 7/0061* (2013.01); *B81C 1/00269* (2013.01); *H01L 21/4817* (2013.01); *H01L 23/10* (2013.01); *H01L 24/16* (2013.01); *H01L 24/32* (2013.01); *H01L 24/48* (2013.01); *B81B 2201/0257* (2013.01); *B81B 2201/0264* (2013.01); *B81B 2207/098* (2013.01); *B81C 2203/019* (2013.01); *B81C 2203/0109* (2013.01); *B81C 2203/032* (2013.01); *B81C 2203/035* (2013.01); *H01L 23/08* (2013.01); *H01L 2224/16227* (2013.01);
(Continued)

(58) Field of Classification Search
CPC .............. B81B 7/0061; B81C 1/00269; H01L 21/4817; H01L 23/10; H01L 24/16; H01L 24/32; H01L 24/48
See application file for complete search history.

(56) References Cited

U.S. PATENT DOCUMENTS 6,524,740 B1 * 2/2003 Broy .................... G01N 27/404
204/429
8,124,953 B2   2/2012 Elian et al.
(Continued)

FOREIGN PATENT DOCUMENTS

DE   102010015886 A1   9/2010
DE   102009019446 B4   11/2014
DE   102017115405 B3   12/2018

OTHER PUBLICATIONS

Wikipedia, "Flip-Chip-Mounting," https://de.wikipedia.org/wiki/Flip-Chip-Montage, Oct. 5, 2019, 8 pages.

*Primary Examiner* — Jasmine J Clark
(74) *Attorney, Agent, or Firm* — Slater Matsil, LLP

(57) ABSTRACT

In an embodiment A package includes a casing having an opening and enclosing a cavity, a die accommodated in the cavity and a membrane attached to the casing, the membrane being air-permeable, covering and sealing the opening, wherein the membrane is configured to allow only a lateral gas flow, and wherein a blocking member is configured to block a vertical gas flow through the membrane into the cavity, the blocking member tightly covering a surface of the membrane at least in an area comprising the opening.

19 Claims, 4 Drawing Sheets

(51) Int. Cl.
  *B81C 1/00* (2006.01)
  *H01L 21/48* (2006.01)
  *H01L 23/10* (2006.01)
  *H01L 23/08* (2006.01)

(52) U.S. Cl.
  CPC ............... *H01L 2224/32225* (2013.01); *H01L 2224/48227* (2013.01); *H01L 2924/1433* (2013.01)

(56) References Cited

U.S. PATENT DOCUMENTS

| | | |
|---|---|---|
| 8,571,239 B2 | 10/2013 | Feiertag et al. |
| 9,936,306 B1 * | 4/2018 | Zhang ................... B81B 7/0061 |
| 2004/0245586 A1 | 12/2004 | Partridge et al. |
| 2010/0307786 A1 | 12/2010 | Kohl et al. |
| 2011/0147803 A1 | 6/2011 | Henneck et al. |
| 2014/0268625 A1 | 9/2014 | Sherrer et al. |
| 2017/0174507 A1 | 6/2017 | Chakravarty et al. |
| 2020/0169818 A1 | 5/2020 | Rombach et al. |

* cited by examiner

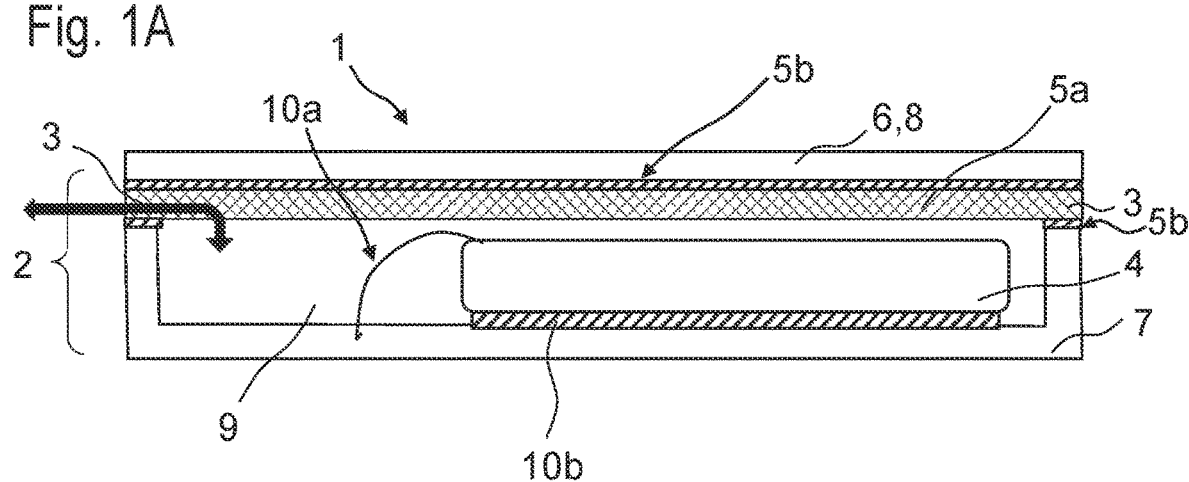
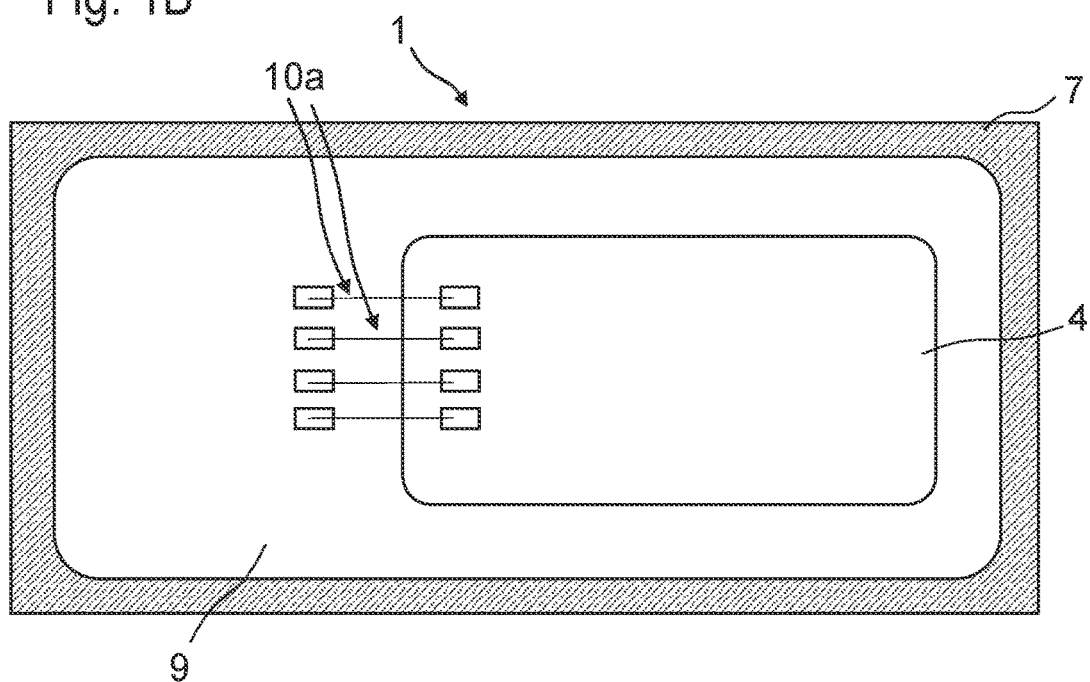

PACKAGED DIE AND ASSEMBLING METHOD

CROSS-REFERENCE TO RELATED APPLICATIONS

This application claims priority to German Application No. 102020102493.2, filed on Jan. 31, 2020, which application is hereby incorporated herein by reference.

TECHNICAL FIELD

The present invention relates to a package comprising a casing and a die enclosed in the casing. The casing has an opening. The opening is used as port between the environment and the cavity inside the package.

BACKGROUND

In prior art packages comprise a casing and a die enclosed in the casing. Typically a waterproof membrane is connected to an inner surface of the casing. In some sensor applications, e.g. microphones, the membrane is placed in front of the sensor die. If a higher level of protection is required dies are protected by silicone gel or steel membranes. This level of protection is for example required for pressure sensors.

Patent document DE 102017115405 B3 discloses a MEMS microphone comprising a carrier board and a MEMS die mounted thereon over an opening acting as a port. A filter chip comprises a bulk material with an aperture covered and closed by a mesh. The mesh comprises a layer of a filter chip with parallel through-going first holes structured in the layer. The filter chip is arranged in or on the carrier board such that the mesh covers the opening.

Patent document DE 102009019446 B4 discloses a sensor based on a MEMS die. The sensor is arranged on a carrier board wherein a required media access opening is provided. An integrally filter mesh covers said opening. The mesh is applied in unstructured form over the whole surface of the carrier board. Then, a structuring is performed to produce preferably at the same time a perforation forming the filter mesh.

Especially for sensor dies more or less direct contact to the environment is required. Typical applications are pressure sensors, gas sensors, humidity sensors and microphones. These devices may be integrated in various consumer products like mobile phones, smart watches or navigation devices. The mentioned devices may exposed to harsh environments during use thereof.

Therefore protection against dust and water is desirable. Typically membranes or polymer meshes are used to guarantee a required water resistance. However sealing the casing causes a considerable additional expenditure in the production. Additionally a possible repair may become difficult as an injury to the membrane at any point affects the tightness of the whole casing. Furthermore the sensitivity and the response time of the sensor may deteriorate compared to an assembly without sealing.

SUMMARY

Embodiments provide a package for a die, preferably a sensor, having an improved sealing against the environment which compared to a naked sensor does not worsen the mechanical and electrical device performance too much. Further embodiments provide a sealing for the package which is easy to manufacture and detains liquids or particles from the environment better than known solutions.

A package comprises a casing which has an opening. The casing encloses a cavity. A die is accommodated in the cavity. A membrane which is air-permeable is attached to the casing. The membrane covers and seals the opening. A vertical gas flow through the membrane into the cavity is blocked by a blocking member in such way that only a lateral gas flow within the membrane is possible. A vertical direction means here and in the following a direction normal to the plane of the membrane. The blocking member is tightly covering a surface of the membrane at least in the area of the opening.

The disclosed arrangement allows a tight sealing of the die without the need for a complete encapsulation of the package. Openings in the package are necessary for the signal input if the die is used as a sensor. For example the die may be a pressure sensor, gas sensor, humidity sensor or microphone. The openings are the only places where ambient substances like water or dust could enter the casing. Hence, when the opening is sealed, the whole package is sealed.

Usually such sensor packages can be mounted in the housing of an electric or electronic device. Typical examples for the mentioned device are mobile phones, smart watches or navigation devices. If the cavity within the package is sealed, it is sufficient to seal the interface between the sealed package and the device's housing in order to obtain a water and dust proof device. The sealing may be easily achieved by a standard O-ring or rubber seal between the package and the housing.

In spite of the tight waterproof and dustproof sealing the membrane is still air-permeable. Thus the required air flow through the membrane to allow sensitive measurements of pressure, gas composition or humidity is ensured. Because of the lateral air flow in the membrane no additional interposer structures for forming a passage for the air between the environment and the die are required.

Furthermore no additional structural components are required for mounting or fixing the membrane. The membrane is included in the conventional structure of the package and may be fixed by adhering the membrane to a surface of the casing. In an embodiment, the membrane is fixed by squeezing between different parts of the casing.

In an embodiment, the casing comprises a substrate and a lid joined together, thereby enclosing the cavity.

The substrate may have the shape of a tub or a box with an open side at the upper side. The lid may have the shape of a board with a minimum size according to the open side of the substrate. The lid may be shaped to fit to and close the open side of the substrate. In another embodiment, the lid may be shaped like a tub or a box with an open side at the bottom and the substrate may be shaped like a board. The substrate may be shaped to fit and close the open side of the lid.

The substrate is defined as the part of the casing at the bottom of the package. The lid is defined as the part of the package at the top of the package. Lid and substrate are shaped to enclose a cavity which accommodates the die.

In an embodiment, the opening in the casing is formed between the lid and the substrate. Both, lid and substrate may be designed as described above.

In this embodiment, the membrane may be arranged on the inner surface of the lid. Inner surfaces are surfaces directed into the cavity. The membrane may be mounted on the lid by an adhesive. The membrane has a shape and a size to cover and seal at least the opening. By covering the whole inner surface of the lid the membrane is designed to accordingly cover and seal the opening between the lid and the substrate.

In this case, the membrane serves as an interposer leaving a gap for air supply between the lid and the substrate. Additionally the membrane serves as a cover for sealing said gap against liquids or dust. The lateral air-permeability of the membrane allows a lateral gas flow which makes further interposer structures between the substrate and the lid dispensable.

Positioned between two independent parts of the casing, the substrate and the lid, the membrane further acts as a mechanical decoupling component reducing thermomechanical stress or bending stress that may build up when different materials are used for substrate and lid.

In an embodiment, the opening is formed in the lid. In this case, lid and substrate are tightly fixed together. In this case, no gap is formed between the lid and the substrate. Lid and substrate may be tightly fixed by an adhesive or a soldered interconnection. The membrane covers the opening in the lid and the surrounding lid area onto which the membrane is fixed. The membrane may be fixed on the lid by an adhesive.

In another embodiment, the opening is formed in the substrate. In this case, substrate and lid are tightly fixed together as well. No gap is formed between the lid and the substrate. The membrane covers the opening in the substrate and the surrounding area of the substrate. The membrane may be fixed onto the substrate by an adhesive. Such an arrangement may be useful for building a microphone.

In all disclosed embodiments, the membrane serves as a sealing of the opening in the casing and as an interposer forming a lateral passage for an air or gas flow at the same time. The membrane may be attached at the casing on one side and covered by a blocking member on the other side. The narrow lateral sides of the membrane are not blocked. The blocking member hinders a vertical gas flow through the membrane. A lateral gas flow through the membrane is possible.

In an embodiment the die is used as the blocking member. In particular, in embodiments wherein the membrane covers an opening in the substrate or an opening in the lid, the die may cover most of the surface on the other side of the membrane. Thus, even though vertical gas diffusion through the membrane is possible, a vertical gas flow is blocked and only a lateral gas flow is still possible.

In an embodiment, the die may comprise a functional opening, which allows a vertical gas flow through the membrane into the functional opening of the die. No gas flow through the die into the cavity is possible. Such an arrangement may be useful for building a microphone.

In another embodiment, the blocking member is a part of the casing. The blocking member may either be the lid or the substrate. The outer surface of the membrane may be covered by either the lid or the substrate. An outer surface is a surface averted from the cavity. In this embodiment, the opening may be between the lid and the substrate. The opening may either be an open side of the substrate or of the lid.

If the opening is an open side of the substrate, the lid is shaped as a board closing the casing. The lid covers the outer surface of the membrane. If the opening is an open side of the lid, the substrate is shaped as a board closing the casing. The substrate covers the outer side of the membrane. Since every time one side of the membrane is covered by a blocking member, no vertical gas flow through the membrane appears.

In each embodiment, the blocking member is a part that is already present in a conventional package and hence, no additional components are required with the exception of the membrane.

In a preferred embodiment, the membrane may be fixed to the blocking member by an adhesive.

In an embodiment, the membrane is hydrophobic. Therefore no water or other hydrophilic liquids are able to pass the membrane in a defined pressure range. If the pressure exceeds a critical value, the penetration of liquids into the membrane may be possible. The critical pressure value can be modified and set by appropriately selecting the membrane's properties like the membrane's material or tightness. In typical consumer products like mobile phones, watches or navigation devices the membrane should guarantee water resistance up to at least 1 m of water depth. In a preferred embodiment the membrane should guarantee water resistance up to 2 m of water depth or more.

In an embodiment, the membrane consists of polytetrafluor-ethylene (PTFE). The PTFE polymer may be expanded. The expansion of the PTFE polymer allows the modification of its properties. For example, a TEMISH® membrane may be used. The membrane may have a high air-permeability due to at least 1 million micro-pores per square centimetre. On the other hand the micro-pore structure prevents the entry of dust and water. The micro-pores may have a diameter in the range of 0.1 to 10 μm. Thus, the membrane filters out particles and water droplets or gaseous humidity to let pass only clean air. Advantages of an expanded PTFE polymer are a high chemical resistance, heat resistance, water resistance, weatherability and electric insulation.

The die may comprise a micro-electromechanical structure (MEMS). The MEMS may comprise a semiconductor material. The MEMS may function as a sensor or a microphone. The MEMS may be shaped as a chip.

In another embodiment, the die may comprise an application-specific integrated circuit (ASIC). The ASIC may comprise a semiconductor material. The ASIC may be shaped as a chip. Furthermore the package may comprise several dies of which one may be a MEMS and another one may be an ASIC. MEMS and ASIC may be electrically connected. Both the MEMS and the ASIC may act as a blocking member.

In an embodiment, the substrate comprises a ceramic material. In another embodiment, the substrate comprises a laminate. The substrate forms at least the bottom of the package. In an embodiment, the substrate may be formed as a tub or a box with an open side at the upper side. In another embodiment, the substrate may only comprise the bottom side of the package.

The die, either MEMS or ASIC, may be electrically contacted on the substrate. In order to contact the die with external circuits or electrical devices at least one surface of the die comprises bond pads. This side is designated as bonding surface. The contacting may be performed by a wire bond or by soldering the bonding surface of the die on the substrate.

In an embodiment, the package may be designed as a wire bond package in which the bond pads are electrically connected to respective contacts of the substrate by wires.

In another embodiment, the package may be formed as a flip-chip package. In this embodiment the die is flipped in such way that the bonding surface faces the substrate at the bottom of the package. The bond pads of the die are electrically connected by solder bumps or conductive adhesive bumps with the substrate. The conductive adhesive may be an epoxy resin.

In an embodiment, the lid comprises or consists of a metal. The lid may be designed as a tub or box with an opening at the bottom. In another embodiment, the lid may be formed as a board covering the substrate on its upper side.

The lid and the substrate may be connected by a connecting member comprising for example an adhesive or solder. The adhesive or solder may be applied as bumps covering the edge of the substrate which faces the lid and the edge of the lid which faces the substrate.

In a preferred embodiment, the connecting members may be applied with a distance of about 100 μm between each two members. Connected by solder or the adhesive, the lid and the substrate may squeeze the membrane covering the opening between lid and substrate. The membrane may be fixed by squeezing it between the substrate and the lid. In this case no fixation of the membrane by an adhesive is required.

In this embodiment, the connecting member connecting lid and substrate penetrates the membrane. The penetration is realized by cutting recesses into the membrane which may be filled with adhesive or solder. The recesses may be cut by a laser.

In an embodiment, in which no opening is required between substrate and lid, these two components may be connected by a continuous ring of adhesive or solder. Such a tight connection may improve the RF immunity of the package. In this embodiment, the opening may be formed in the substrate or in the lid.

In an embodiment, the bonding pads on the bonding surface of the die are electrically and mechanically connected to respective contacts on the substrate by a fixing member comprising for example a conductive adhesive or solder. In this embodiment, the bonding surface of the die faces the substrate. Since the bonding surface of the die is flipped to the bottom the package is designated as a flip-chip package.

In a further embodiment the bonding surface does not face the surface of the substrate. In this case the die may be electrically contacted by wires. However, the die may still be mechanically fixed on the substrate by said fixing members.

The membrane may be arranged at the substrate covering the opening therein. The die is arranged inside the cavity of the package and covers the membrane as a blocking member. The membrane comprises recesses for fixing members between the die and the substrate surrounding the opening. By these fixing members the die is mounted inside the package. The fixing members may comprise conductive materials like conductive adhesives or solder connecting the bonding pads and the substrate electrically.

Said recesses are only cut in portions of the membrane covered by the die as a blocking member. Since the membrane is covered no penetration of undesired liquids or dust through the recesses is possible.

Because the blocking member hinders vertical gas flow, gas flow is only possible in a lateral direction. In no embodiment, a vertical gas flow from the environment directly into the cavity enclosed by the casing is possible.

Further embodiments provide a method of assembling a package comprising the following steps: providing a die comprising bond pads, and a substrate and a lid, both part of a casing enclosing a cavity, wherein the lid comprises an opening. Arranging a membrane onto a surface of the substrate. Arranging the die at the casing. Attaching the substrate with attached membrane and the lid in such way that the membrane covers the opening thereby closing the casing enclosing the die.

In an embodiment the die may be arranged at the substrate. The arranging method may comprise the following steps: Forming recesses in the membrane arranged at the substrate. Filling the recesses with fixing members comprising conductive material. Arranging the die on the fixing members in such way that the die is mechanically fixed and electrically connected to the substrate.

For example, the package is assembled by the following method, comprising steps of the two recent methods: Providing a die comprising bond pads and a substrate as part of a casing.

Both, die and substrate comprise bond pads for electrical connection. Arranging a membrane onto a surface of the substrate The membrane may be fixed by an adhesive laminated between substrate and membrane.

The membrane may be arranged onto any part of the substrate. The membrane may cover a whole surface of the substrate or a portion of it. Forming recesses in the membrane.

The recesses are formed at positions that match the positions of the bond pads on the surface. The recesses can be formed before the membrane is arranged onto the substrate. In another case, the membrane is fixed before the recesses are formed. The recesses may be cut by a laser. Filling the recesses with fixing members comprising conductive material.

The conductive material may be a conductive adhesive like an epoxy resin or solder. The positions of the fixing members match the bond pads on the substrate's surface and are therefore electrically contacted to the substrate. Arranging the die on the fixing members in such way that the die is mechanically fixed and electrically connected with the substrate. Covering the substrate by a lid in such way that the substrate and the lid form a casing enclosing the die.

By covering the membrane with the substrate as a blocking member no vertical gas flow, either through the membrane or through the vertical recesses, is possible. Only lateral gas flow from the environment entering the membrane at its lateral side at the gap between the lid and the substrate is possible.

According to an embodiment, the membrane covers a whole surface of the substrate. Furthermore the substrate is covered by a lid by connecting substrate and lid by connecting members. In order to connect substrate and lid the following steps may conducted: Forming recesses for connecting members in the membrane.

The recesses may be cut by a laser. The recesses may be cut in the membrane before arranging it on the surface. The recesses are positioned in that portion of the substrate which is later connected to the lid. Filling the recesses to form connecting members.

The connecting member comprise conductive materials like a conductive adhesive or solder. Fixing the lid to the connecting members.

Further embodiments provide a method of assembling a package comprising the following steps: Providing a die comprising bond pads, and a substrate and a lid, both part of a casing enclosing a cavity, wherein the substrate comprises an opening. Arranging a membrane on the substrate in such way that it covers the opening in the substrate. Arranging the die at the casing. Arranging the lid on the substrate to close the casing, thereby enclosing the die.

In an embodiment the die may be arranged at the substrate. The arranging method may comprise the following steps: Forming recesses in the membrane arranged at the substrate. Filling the recesses with fixing members comprising conductive material. Arranging the die on the fixing members in such way that the die is mechanically fixed and electrically connected to the substrate.

According to an embodiment, the membrane covers an opening in the surface of the substrate. In this case, the membrane may not cover the whole surface of the substrate. No further recesses are formed into the membrane.

According to another embodiment the opening is an open side of the substrate. In this case, the membrane covers the open side of the substrate. Furthermore the membrane is blocked by a blocking member, namely the lid to block a vertical gas flow. The die may be fixed at the substrate and furthermore may not touch the membrane.

According to a further embodiment, membrane and die are fixed together, for example by an adhesive, before the membrane is arranged on the substrate. The recesses in the membrane may be cut before or after fixing the membrane at the die.

The method disclosed above may comprise a further step: A carrier like for example a printed circuit board (PCB) is arranged on the substrate and mounted by a liquid-impermeable mounting element on said substrate. The liquid-impermeable mounting element may be a soldering or a double adhesive tape. The disclosed method allows the assembly and sealing of the package in a simple and flexible way that is adaptable to technical requirements.

BRIEF DESCRIPTION OF THE DRAWINGS

In the following the invention will be explained in more detail with reference to preferred embodiments and their relating figures. The figures are schematically drawn only for better understanding and are not drawn to scale. Identical or equivalent parts are referenced by the same reference symbols. Possible embodiments are not limited to the embodiments disclosed.

FIG. 1A shows in a cross-sectional view a first embodiment of the package;

FIG. 1B shows a top view of an open-topped substrate of the first embodiment of the package;

DETAILED DESCRIPTION OF ILLUSTRATIVE EMBODIMENTS

Figure 2A:
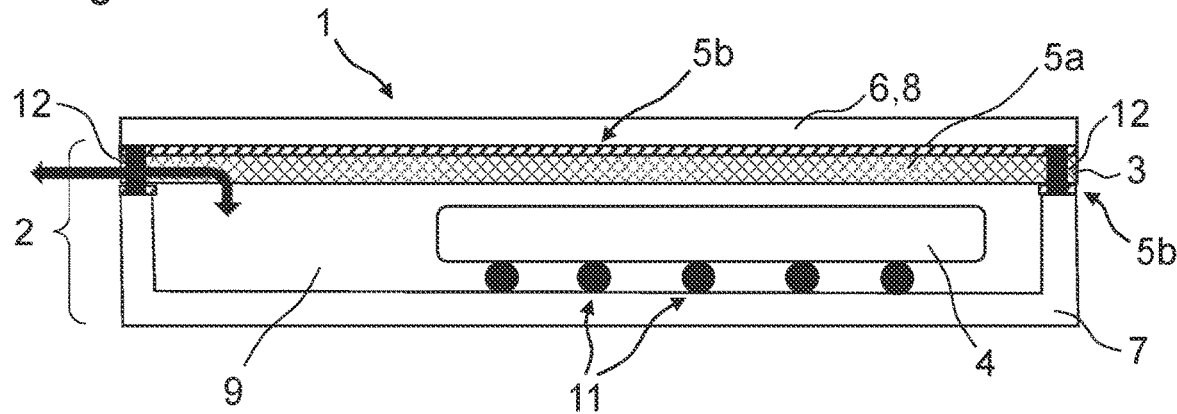
FIG. 2A shows in a cross-sectional view a second embodiment of the package with the die electrically contacted by the flip-chip method.

FIG. 1A shows, in a cross-sectional view, a first embodiment of the package 1 according to embodiments. The package comprises a casing 2. The casing 2 consists of two separated parts. A substrate 7 comprises the bottom side and the four lateral sides of the casing formed as a box. The substrate 7 may consist of a ceramic material.

The second part of the casing 2 is a lid 8 forming the upper side of the casing 2. The lid 8 may consist of a metallic material. The lid 8 is shaped accordingly to fit on the substrate 7 from the top. Between the substrate 7 and the lid 8 a cavity 9 is formed enclosed by the casing 2.

Between the upper edge of the substrate 7 and the lid 8 a membrane 5a is arranged acting as an interposer between the substrate 7 and the lid 8. The membrane is air-permeable and fills a gap 3 left for air supply to the cavity.

The membrane 5a consists of extended polytetrafluorethylene (PTFE) polymer. For example a TEMISH® membrane may be used. The membrane 5a comprises at least 1 million micropores per square centimeter. Therefore air-permeability is guaranteed. Because of the small diameters between 0.1 μm and 10 μm of the micropores the membrane 5a restrains dust particles and liquids.

The membrane 5a is fixed by gluing it by an adhesive 5b to the substrate 7 and the lid 8. Herein the lid 8 acts as a blocking member 6 to block a vertical gas flow. Only a lateral gas flow (fat arrow) through the gap 3 is possible thereby passing the membrane 5a between the substrate 7 and the lid 8 laterally that is within the plane of the membrane. Therefore the membrane 5a has two functions.

On the one hand, the membrane acts as an interposer leaving a kind of a gap 3 in the casing 2 which allows an air flow from the environment into the cavity 9. On the other hand, the membrane 5a acts as a seal restraining liquids and dust from entering the package 1.

A MEMS die 4 is accommodated in the cavity 9. The MEMS die 4 may act as sensor. The sensor may be a gas sensor, a pressure sensor or a humidity sensor. For exact and sensitive measurements a sufficiently large gas flow from the environment into the cavity 9 is necessary.

For providing electrical contact means the MEMS die 4 comprises a bonding surface with bond pads. The bond pads are connected with the substrate 7 by a wire bond boa. For mechanical fixation the die may be mounted to the bottom of the substrate 7 by a fixing member, an adhesive tape or an adhesive layer 10b.

Since the air or gas to be sensed enters the package 1 on a lateral side the gap 3 may be designated as side port.

In further embodiments, the die 4 may be an ASIC or may comprise both a MEMS and an ASIC.

FIG. 1B shows a top view of the first embodiment of the package with an open-topped substrate 7. The membrane 5a and the lid 8 are omitted in this figure for better clarity. In this example, four wire bonds boa are used to connect the die 4 with the substrate 7.

FIG. 2A shows, in a cross-sectional view, a second embodiment of the package 1 comprising a casing 2 with two parts one of which is the substrate 7 and the other is the lid 8. Substrate 7 and lid 8 may be designed like in the first embodiment. The gap 3 between the substrate 7 and the lid 8 is formed and filled by the membrane 5a acting as an interposer. The membrane 5a further seals the gap 3 against dust and liquids. The membrane 5a is fixed by an adhesive 5b to the substrate 7 and the lid 8.

Since the upper surface of the membrane 5a is blocked by the lid 8 acting as blocking member 6, again no vertical gas flow is possible. Only a lateral gas flow arises. Connecting members 12 like solder bumps or alternatively adhesive bumps are applied on the upper edge of the substrate 7 with a regular distance of around 100 µm between each two bumps. These bumps 12 fix the lid 8 to the substrate 7 thereby squeezing the membrane 5a between the substrate 7 and the lid 8. In this case, no adhesive need to be used to fix the membrane surface at the lid 8. By tightening the membrane 5a by squeezing, the tightness and thus the sealing of the membrane 5a can be improved. However, the membrane 5a can additionally be fixed by an adhesive.

In this embodiment, the connecting member 12 applied as adhesive or solder bumps penetrate the membrane 5a periodically. The penetration is realized by cutting recesses in the membrane 5a which may be filled with an adhesive or solder. The recesses may be cut with a laser.

In the second embodiment, a MEMS die 4 is accommodated in the cavity 9 formed by the casing 2. The die 4 may be electrically contacted by the flip-chip method. This means that the bonding surface of the die with the bond pads for electrical connection is flipped to the bottom. Thus the bonding surface of the die is facing the bottom surface of the substrate 7. Fixing members 11 made of solder or a conductive adhesive are formed on the bond pads of the die 4 and connect the die electrically with the substrate 7. Furthermore the fixing members 11 mount the die 4 mechanically on the surface of the substrate 7.

Figure 2B:
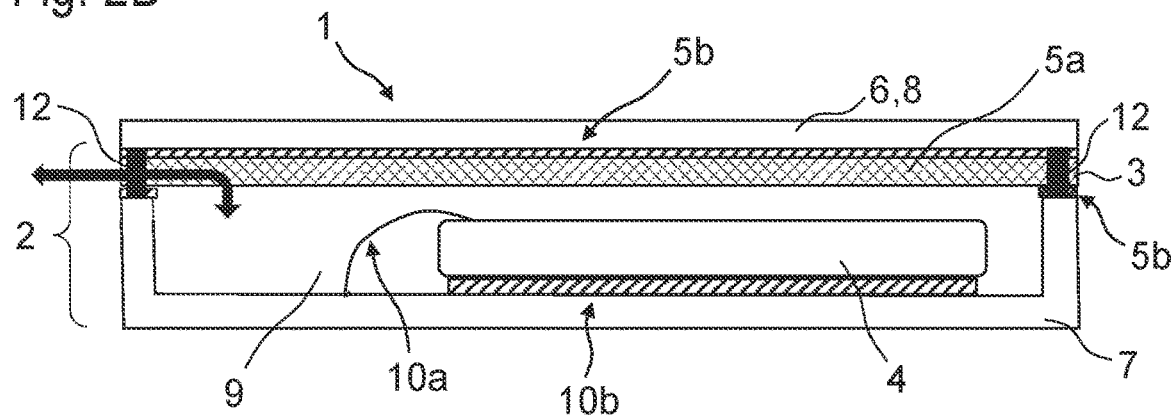
FIG. 2B shows in a cross-sectional view a second embodiment of the package with the die electrically contacted by a wire bond.

Alternatively, the die 4 may be electrically contacted by a wire bond boa as shown in FIG. 2B like in the first embodiment. In this case, the die 4 is mechanically fixed to the surface of the substrate 7 by an adhesive layer bob.

Figure 2C:
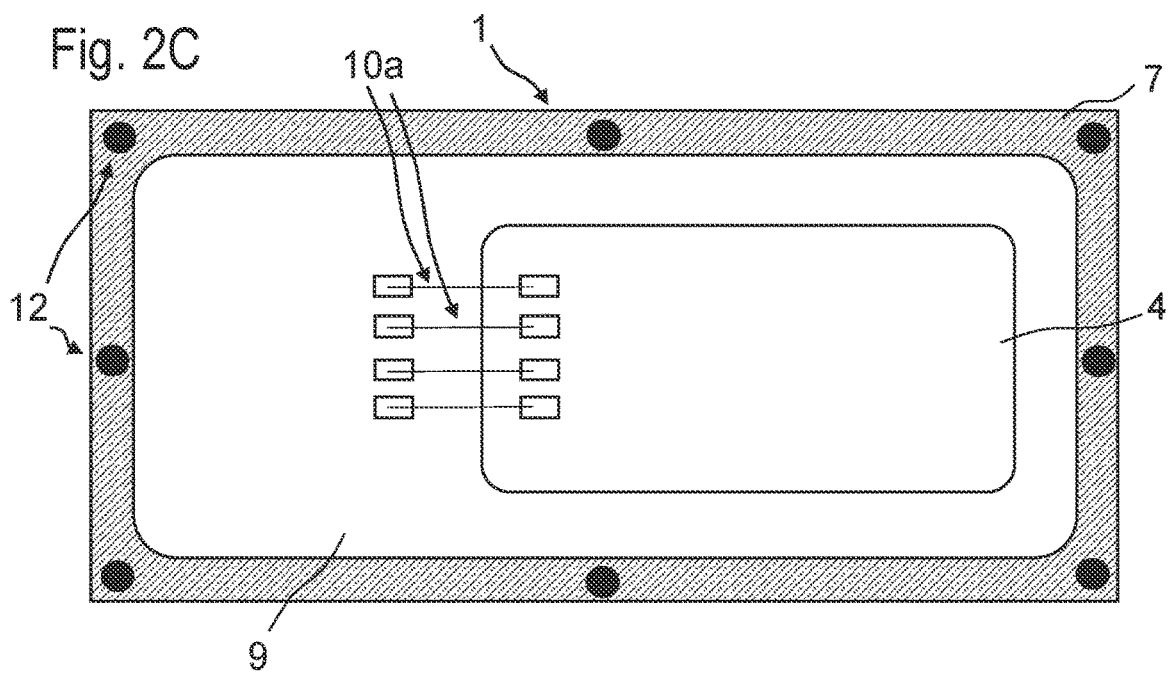
FIG. 2C shows a top view of an open-topped substrate of the second embodiment of the package with the die electrically contacted by a wire bond.

FIG. 2C shows a top view of the second embodiment as shown in FIG. 2B. The substrate 7 is open-topped. The die 4 and the lid 8 are omitted for better clarity. Four wire bonds boa may be used to electrically contact the die 4.

In the second embodiment, the die 4 can act as a sensor, in particular as a sensor measuring pressure, gas or humidity.

Figure 3:
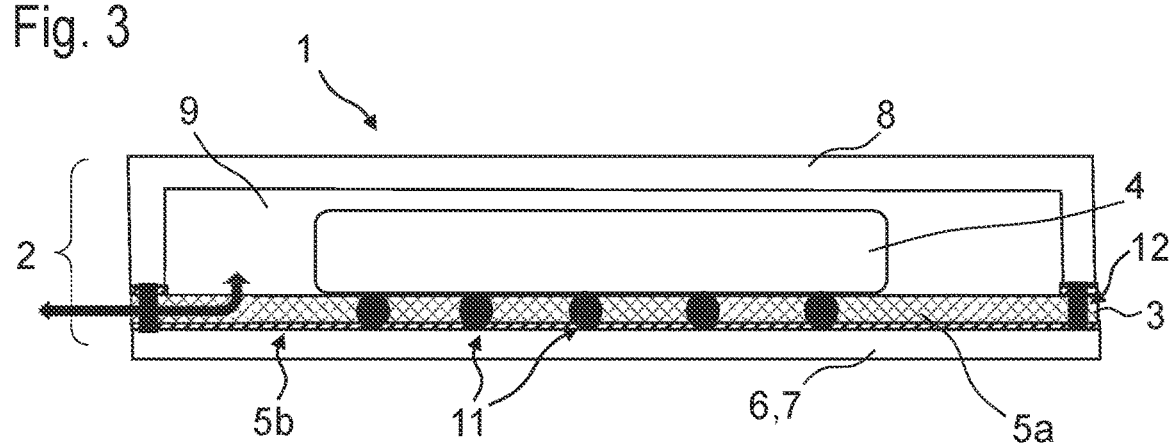
FIG. 3 shows in a cross-sectional view a third embodiment of the package with the die electrically contacted by a flip-chip method and the membrane positioned between die and substrate.

FIG. 3 shows, in a cross-sectional view, a third embodiment of the package 1 with a gap 3 in the casing 2 at its lateral side like in the first and second embodiment. In the third embodiment the lid 8 is formed as a box and comprises or may consist of a metallic material. The lid 8 forms the upper side and the four lateral sides of the box and hence, of the casing.

As a second part of the casing 2 a substrate forms the bottom of the casing 2. The substrate may consist of a laminate. The substrate is shaped accordingly to fit to the opening of the lid 8 that a cavity 9 is enclosed between the lid 8 and the substrate 7.

Between the lower edge of the lid 8 and the substrate 7 the gap 3 is left. The gap 3 is caused by the membrane 5a acting as an interposer.

In spite of its vertical permeability no vertical gas flow arises in the membrane 5a since its lower surface is blocked by the substrate 7 acting as a blocking member 6.

Similar as in the recent embodiments, the membrane 5a is fixed by an adhesive 5b to the substrate 7 and the lid 8.

Accommodated in the cavity 9 is a die 4. The die corresponds to the die of the second embodiment. In order to mechanically fix and electrically contact the die 4 with the substrate 7, solder bumps are positioned as fixing members 11 between the bond pads on the die surface and bond pads on the substrate 7.

Since the membrane 5a is positioned between the substrate 7 and the die 4, recesses are formed in the membrane 5a and the adhesive 5b between membrane and substrate. The recesses are positioned and formed accordingly to accommodate the fixing members 11 at the desired positions. Once the recesses are formed solder is filled into the recesses. Thus the resulting solder bumps 11 are positioned accordingly to connect the substrate 7 and the die 4 electrically. Furthermore the die 4 is fixed by the solder bumps 11 mechanically.

In one method, the recesses in the membrane 5a are formed before arranging the membrane on the substrate 7.

The die 4 may act as a sensor, in particular a pressure, humidity or gas sensor. Instead of solder an adhesive may be used for the fixing and contacting members 11 and 12.

Figure 4:
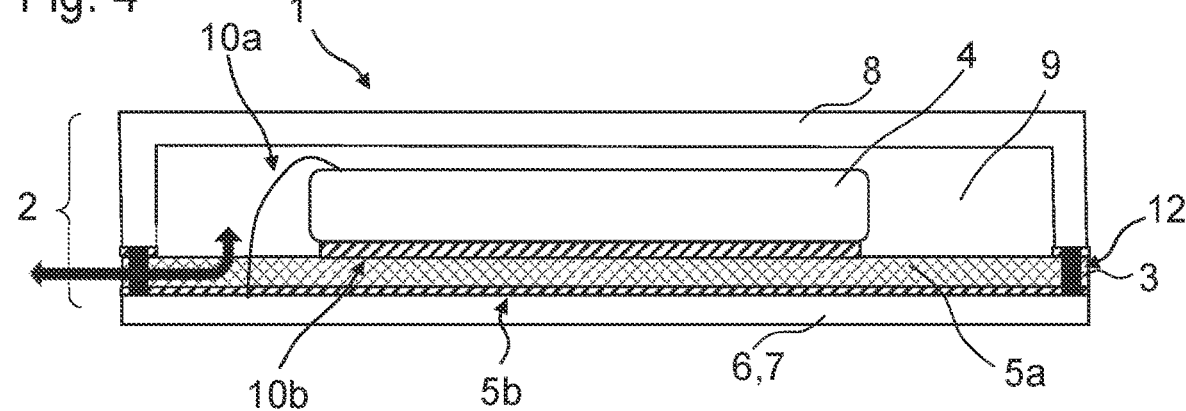
FIG. 4 shows in a cross-sectional view a fourth embodiment of the package with the die electrically contacted by a wire bond and the membrane positioned between the die and the substrate.

FIG. 4 shows, in a cross-sectional view, a fourth embodiment of the package 1. The fourth embodiment resembles the third embodiment of the package 1. The package 1 comprises a casing 2 comprising a lid 8 and a substrate 7. The substrate 7 comprises the bottom of the casing 2. The box-shaped lid 8 comprises the upper side and the four lateral sides of the case 2 and comprises an open side at the bottom. Between the lid 8 and the substrate 7 a cavity 9 is formed.

The cavity 9 accommodates a MEMS die 4. Between the substrate 7 and the lid 8 a gap 3 is caused by a membrane 5a acting as an interposer and fixed by an adhesive 5b to the substrate 7 and the lid 8. The membrane 5a seals the package 1 against water and dust from the environment. The die 4 is fixed by an adhesive tape 10b to the membrane 5a.

In contrast to the third embodiment the die 4 is electrically contacted by a wire bond boa connecting the die 4 with the substrate 7. Therefore the wire penetrates the membrane 5a and the adhesive 5b.

Since the membrane 5a is positioned between the lid 8 and the substrate 7 it also acts as mechanical decoupling component reducing thermomechanical stress and bending stress in the casing 2.

Figure 5A:
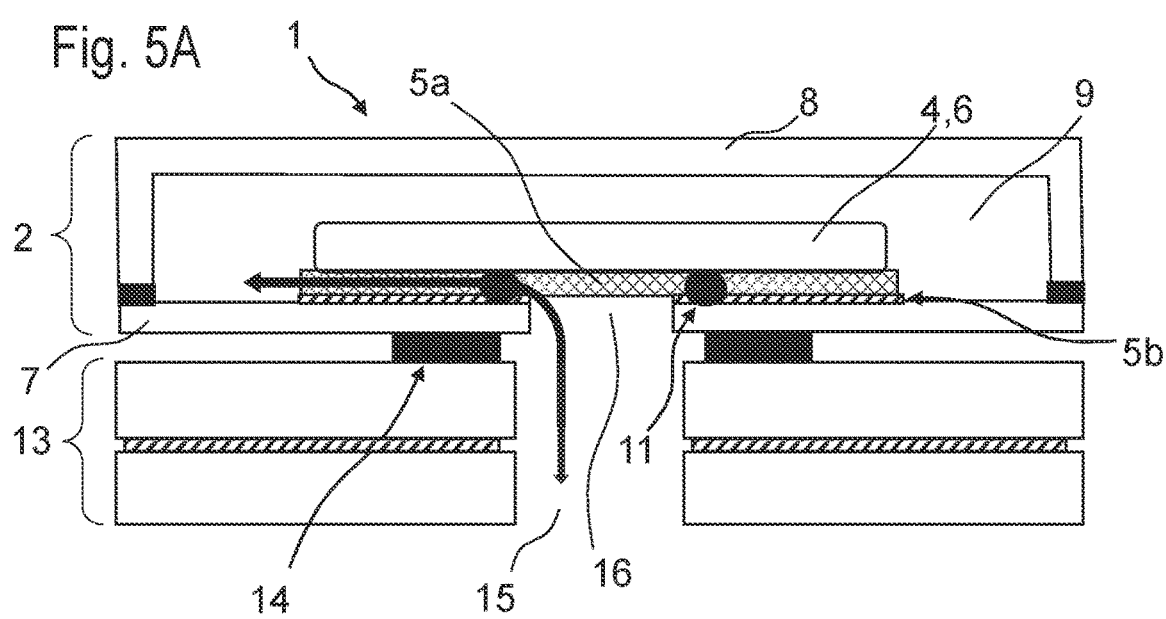
FIG. 5A shows a fifth embodiment of the package with an opening in the substrate covered by a membrane and attached on a printable circuit board with the die electrically contacted by solder balls.

FIG. 5A shows, in a cross-sectional view, a fifth embodiment of the package 1. In contrast to the previous embodiments the fifth embodiment of the package 1 comprises a bottom port. A bottom port means that a measured media enters the package 1 from the bottom side.

The package 1 comprises a casing 2 which comprises a box-shaped lid 8 and a substrate 7. The lid 8 comprises an upper side and four lateral sides. It has an open side at the bottom. The substrate 7 comprises the bottom of the casing 2 and provides an opening 16 that may be arranged in the center of the substrate. The opening 16 may be shaped as a circle. The lid 7 and the substrate 8 are tightly fixed together by solder. Alternatively the lid 7 may be attached by a conductive epoxy resin to the substrate 8. The tight attachment of the lid 7 on the substrate 8 improves the RF immunity of the package 1.

The membrane 5a covers the opening 16 in the substrate 7 from the top. The membrane 5a is attached at the substrate 7 by an adhesive 5b surrounding the edge of the opening 16. The die 4, which is a MEMS, is arranged on the upper surface of the membrane 5a acting as a blocking member to block a vertical gas flow from the opening through the membrane 5a into the cavity 9 enclosed between lid and substrate. Therefore only a lateral gas flow through the membrane 5a is possible. Arrows indicate the gas flow that passes through the opening 16 into the membrane 5a and laterally within the membrane 5a into the cavity 9.

The die 4, whose bonding surface faces the substrate 7, is electrically connected to respective contacts on the substrate 7 by solder bumps as fixing members 11. Therefore recesses are cut by laser into the membrane 5a and the adhesive 5b and are filled with solder material. The solder bumps 11 connect the bond pads on the bonding surface of the flipped die 4 with the substrate 7 electrically and fix the die 4 mechanically.

Figure 5B:
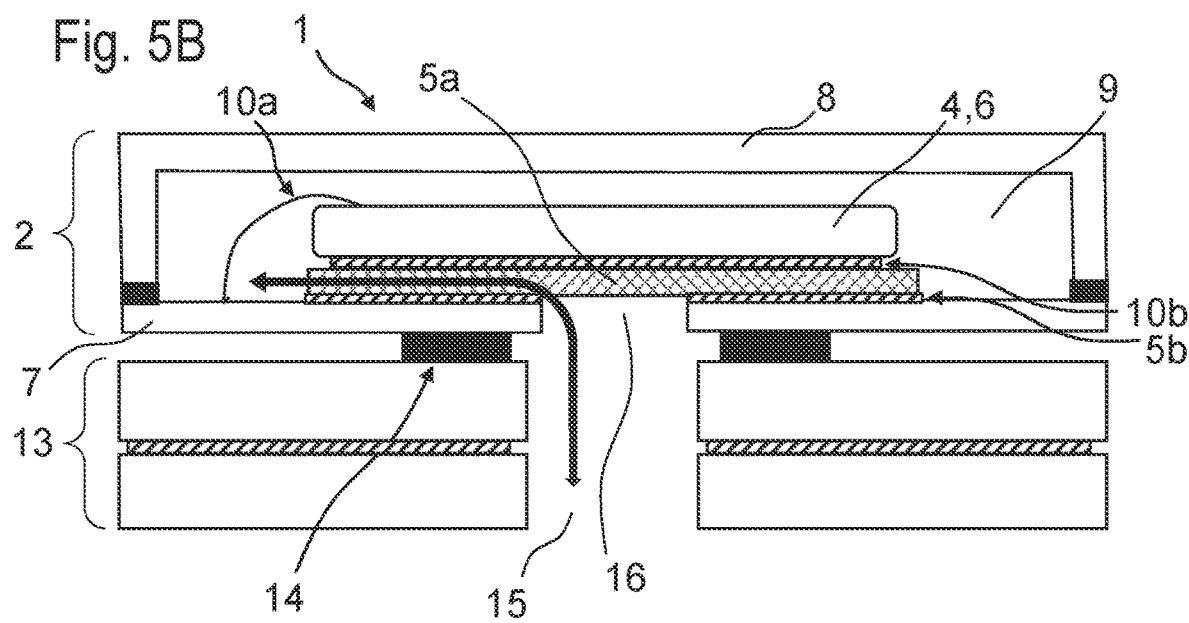
FIG. 5B shows a fifth embodiment of the package with an opening in the substrate covered by a membrane and attached on a printable circuit board with the die electrically contacted by a wire bond.

Alternatively, the die 4 may be electrically contacted to the substrate 7 by a wire bond boa as shown in FIG. 5B, similar to the first embodiment. In this case, the die 4 is mechanically fixed to the surface of the membrane 5a by an adhesive layer 10b.

The substrate 7 is mounted on a carrier 13 like for example a printed circuit board (PCB). The carrier 13 may consist from several components, which are adhesively attached. The substrate 7 is mounted on the carrier by a soldering or a conductive adhesive 14. To enable gas supply the carrier 13 comprises an opening 15 which is positioned under the opening 16 in the substrate 7. The substrate 7 and the carrier 13 are tightly attached by the conductive adhesive or the soldering 14 through which no gas supply is possible.

The gas analyzed by the MEMS die 4 acting as a sensor enters the package 1 through the opening 15, flows through the opening 16 and penetrates the membrane 5a in a lateral stream reaching the cavity 9. The carrier 13 may be a part of an electronical device like a mobile phone, smart watch or a navigation device. The described bottom port approach simplifies the assembly and the sealing of the package including the carrier.

The fifth embodiment may be configured to act as a microphone. Therefore a separated back volume is required as a reference volume for the sound detection. Therefore a continuous ring of solder is arranged between the substrate 7 and the die 4 instead of the fixing members 11. The continuous ring acts as seal separating the back volume in the cavity 9 from the environment. Thus no gas flow between the environment and the cavity 9 is possible.

If the MEMS die 4 is configured as a microphone it comprises a functional opening connected with the back volume of the cavity 9. This functional opening is centrally positioned above the opening 16 and covered by a membrane for sound detection. This membrane is configured as an acoustic seal. The ambient acoustic waves enter the sensor through the opening 16. The waves penetrate the membrane 5a covering the opening 16 to be detected by the acoustic sealed membrane. No gas flow into the cavity 9 is possible. Furthermore the membrane 5a restrains undesired liquids or dust particles before reaching the microphone.

The microphone may further comprise an ASIC, which is a small semiconductor die that supports and controls the function of the MEMS.

Notwithstanding the number of exemplary embodiments, the invention is not restricted to the shown embodiments. The die may be any kind of sensing die. The scope of the invention shall only be limited by the wording of the claims.

What is claimed is:

1. A package comprising:
a casing having an opening and enclosing a cavity;
a die accommodated in the cavity; and
a membrane attached to the casing, the membrane being air-permeable, covering and sealing the opening,
wherein the membrane is configured to allow gas to flow into the cavity mainly in a lateral direction, and
wherein a blocking member tightly covers a surface of the membrane vertically adjacent to the opening so that the blocking member is configured to block a vertical gas flow through the membrane towards the blocking member.

2. The package of claim 1, wherein the casing comprises a substrate and a lid joined together, thereby enclosing the cavity.

3. The package of claim 2, wherein the opening is formed between the substrate and the lid.

4. The package of claim 2, wherein the opening is formed in the substrate or in the lid.

5. The package of claim 1, wherein the blocking member is the die.

6. The package of claim 1, wherein the blocking member is part of the casing.

7. The package of claim 1, wherein the membrane is hydrophobic.

8. The package of claim 1, wherein the membrane consists essentially of polytetrafluorethylene (PTFE).

9. The package of claim 1, wherein the die comprises a micro-electromechanical structure (MEMS) or an application-specific integrated circuit (ASIC).

10. The package of claim 2, wherein the substrate comprises a ceramic material or a laminate.

11. The package of claim 2, wherein the lid consists essentially of metal.

12. The package of claim 2, wherein the lid and the substrate are connected by a connecting member and fix the membrane by squeezing it there between.

13. The package of claim 2, wherein bonding pads on the surface of the die are electrically and mechanically connected to respective contacts on the substrate by a fixing member.

14. The package of claim 13, wherein the membrane is arranged between the die and the substrate, and wherein the membrane comprises recesses accommodating the fixing members connecting the bonding pads and the substrate.

15. A method for assembling a package, the method comprising:
providing a die comprising bond pads;
providing a substrate and a lid, both being part of a casing that encloses a cavity, wherein the lid comprises an open side;
arranging a membrane onto a surface of the substrate;
arranging the die in the casing; and
attaching the substrate with attached membrane on the open side of the lid such that the membrane covers an opening between the substrate and the lid thereby closing the casing and enclosing the die.

16. The method of claim 15, further comprising:
forming recesses in the membrane, wherein the membrane is arranged at the substrate;
filling of the recesses with fixing members comprising a conductive material; and
arranging the die on the fixing members so that the die is mechanically fixed and electrically connected to the substrate.

17. The method of claim 15,
wherein the membrane covers the whole surface of the substrate,
wherein the substrate and the lid are attached by connecting members, and
wherein attaching the substrate and the lid comprises:
forming recesses for the connecting members in the membrane, filling the recesses to form the connecting members, and fixing the lid to the connecting members.

18. A method for assembling a package, the method comprising:

providing a die comprising bond pads;

providing a substrate and a lid, both being part of a casing that encloses a cavity, wherein the substrate comprises an opening;

arranging a membrane on the substrate such that the membrane covers the opening in the substrate;

arranging the die in the casing; and arranging the lid on the substrate to close the casing, thereby enclosing the die.

19. The method of claim 18, wherein arranging the die at the substrate comprises:

forming recesses in the membrane arranged at the substrate, filling the recesses with fixing members comprising conductive material, and arranging the die on the fixing members so that the die is mechanically fixed and electrically connected to the substrate.

\* \* \* \* \*